(12) United States Patent
Asanaka (10) Patent No.: US 9,047,119 B2
(45) Date of Patent: Jun. 2, 2015

(54) CIRCULAR FLOATING-POINT NUMBER GENERATOR AND A CIRCULAR FLOATING-POINT NUMBER ADDER

(75) Inventor: Kazunori Asanaka, Yokohama (JP)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 278 days.

(21) Appl. No.: 13/806,789

(22) PCT Filed: Jul. 1, 2010

(86) PCT No.: PCT/JP2010/061577
§ 371 (c)(1),
(2), (4) Date: Dec. 24, 2012

(87) PCT Pub. No.: WO2012/001819
PCT Pub. Date: Jan. 5, 2012

(65) Prior Publication Data
US 2013/0103732 A1    Apr. 25, 2013

(51) Int. Cl.
*G06F 7/00* (2006.01)
*G06F 7/483* (2006.01)
*G06F 7/485* (2006.01)
*H03M 7/24* (2006.01)

(52) U.S. Cl.
CPC .............. *G06F 7/4833* (2013.01); *G06F 7/485* (2013.01); *H03M 7/24* (2013.01)

(58) Field of Classification Search
None
See application file for complete search history.

(56) References Cited

U.S. PATENT DOCUMENTS

| 3,872,442 A * | 3/1975 | Boles et al. ................... 708/204 |
| 4,617,641 A | 10/1986 | Hamada |
| 5,161,117 A * | 11/1992 | Waggener, Jr. ............... 708/204 |
| 5,365,465 A * | 11/1994 | Larson .......................... 708/204 |
| 2007/0299898 A1 | 12/2007 | Richey et al. |
| 2013/0103732 A1 * | 4/2013 | Asanaka ....................... 708/505 |

FOREIGN PATENT DOCUMENTS

| JP | 61062931 A | 3/1986 |
| JP | 2006318382 | 11/2006 |

* cited by examiner

*Primary Examiner* — David H Malzahn
(74) *Attorney, Agent, or Firm* — Murphy, Bilak & Homiller, PLLC (57) ABSTRACT

One aspect of the present invention will provide a circular floating-point number generator (400) for generating, from an input fixed-point number, a circular floating-point number including sign-bit field (S), exponent field (E), and circular-mantissa field (M). The generator assigns the input bits in the fixed-point number to a plurality of slots, generates the sign-bit field (S), generate the exponent field (E) based on a bit position of a leading significant bit, and generate the mantissa field (M) by extracting a first bit group and a second bit group and by providing a start bit of the first bit group after a last bit of the second bit group.

8 Claims, 13 Drawing Sheets

| M(A) | 1 | 0 | 0 | 1 | 0 | 1 | 1 | 0 |
|---|---|---|---|---|---|---|---|---|
| M(B) | 1 | 0 | 0 | 1 | 0 | 1 | 1 | 0 |

FIG. 7B

| Mask for M(A) | 0 | 0 | 0 | 1 | 1 | 1 | 1 | 1 | 1 | 1 | 0 | 0 | 0 | 0 | 0 |
|---|---|---|---|---|---|---|---|---|---|---|---|---|---|---|---|
| Unfold result of M(A) | 0 | 0 | 1 | 1 | 0 | 1 | 1 | 0 | 1 | 0 | 0 | 0 | 0 | 0 | 0 |

FIG. 7C

| Mask for M(B) | 0 | 0 | 0 | 0 | 0 | 0 | 1 | 1 | 1 | 1 | 1 | 1 | 1 | 0 | 0 |
|---|---|---|---|---|---|---|---|---|---|---|---|---|---|---|---|
| Unfold result of M(B) | 0 | 0 | 0 | 0 | 0 | 1 | 1 | 0 | 1 | 0 | 0 | 1 | 0 | 1 | 0 | 0 |

FIG. 7D

Add:

| 0 | 0 | 1 | 1 | 0 | 1 | 1 | 0 | 1 | 0 | 0 | 0 | 0 | 0 | 0 |
|---|---|---|---|---|---|---|---|---|---|---|---|---|---|---|

+

| 0 | 0 | 0 | 0 | 0 | 1 | 1 | 0 | 1 | 0 | 0 | 1 | 0 | 1 | 0 | 0 |
|---|---|---|---|---|---|---|---|---|---|---|---|---|---|---|---|

Result:

| 0 | 0 | 1 | 1 | 1 | 1 | 0 | 1 | 0 | 0 | 0 | 1 | 0 | 1 | 0 | 0 |
|---|---|---|---|---|---|---|---|---|---|---|---|---|---|---|---|

Fold result:

| 0 | 0 | 0 | 1 | 1 | 1 | 0 | 1 |
|---|---|---|---|---|---|---|---|

| Type of Processing | | Conventional Floating-Point | Circular Floating-Point |
|---|---|---|---|
| Adder | Align or unfold | $L(L+1)$ cells | $(L+c)\frac{L}{c}$ cells |
| | Lain adder | $L+1$ cells | $L+c$ cells |
| | NorLalize or Fold | $L(L+1)$ cells | $(L+c)\frac{L}{c}$ cells |

CIRCULAR FLOATING-POINT NUMBER GENERATOR AND A CIRCULAR FLOATING-POINT NUMBER ADDER

TECHNICAL FIELD

The present invention relates to a circular floating-point number generator and a circular floating-point adder, particularly to a generator which generates circular floating-point numbers from input fixed-point numbers and a calculation unit for adding two circular floating-point numbers including circular mantissa.

BACKGROUND

In computers or arithmetic hardware, integer and floating-point formats have been widely used to simply describe values that are extremely-large or extremely-small. In the integer format, it is easy to make the hardware to carry out calculations, however, there is a drawback in that the integer format can represent a small range. Thus the algorithm must be scaled such that overflow does not happen. In the floating-point format, a wide range of values can be represented and the algorithm does not need to be scaled to prevent overflow.

Figure 1:
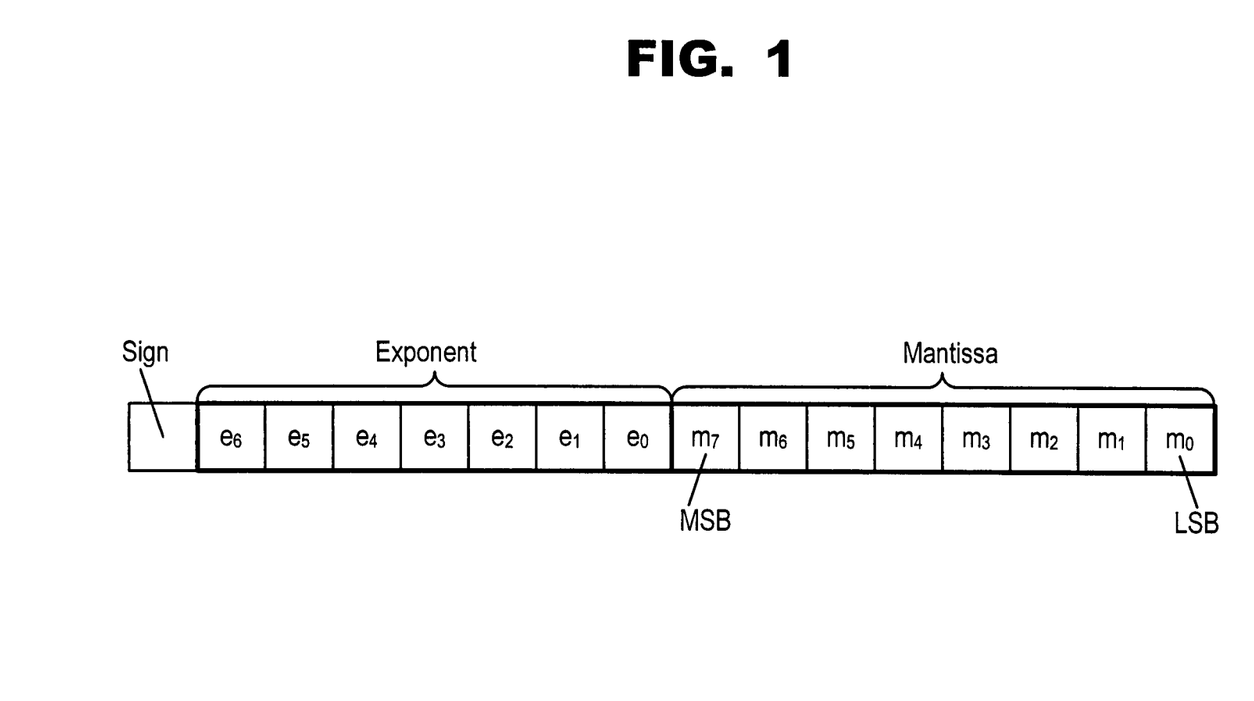
FIG. 1 shows a conventional floating-point format.

IEEE-754 format is the most commonly used for floating-point representation. FIG. 1 shows an example of a conventional floating-point format. The floating-point format is constituted by a 1-bit Sign, a 7-bit Exponent and an 8-bit Mantissa. The addition of values in the floating-point format is complicated, and the circuit size and the logic delay are large. However, so far, since there is no numerical format by which the floating-point format can be replaced, a lot of researches have been made for the calculation in this format.

Figure 2:
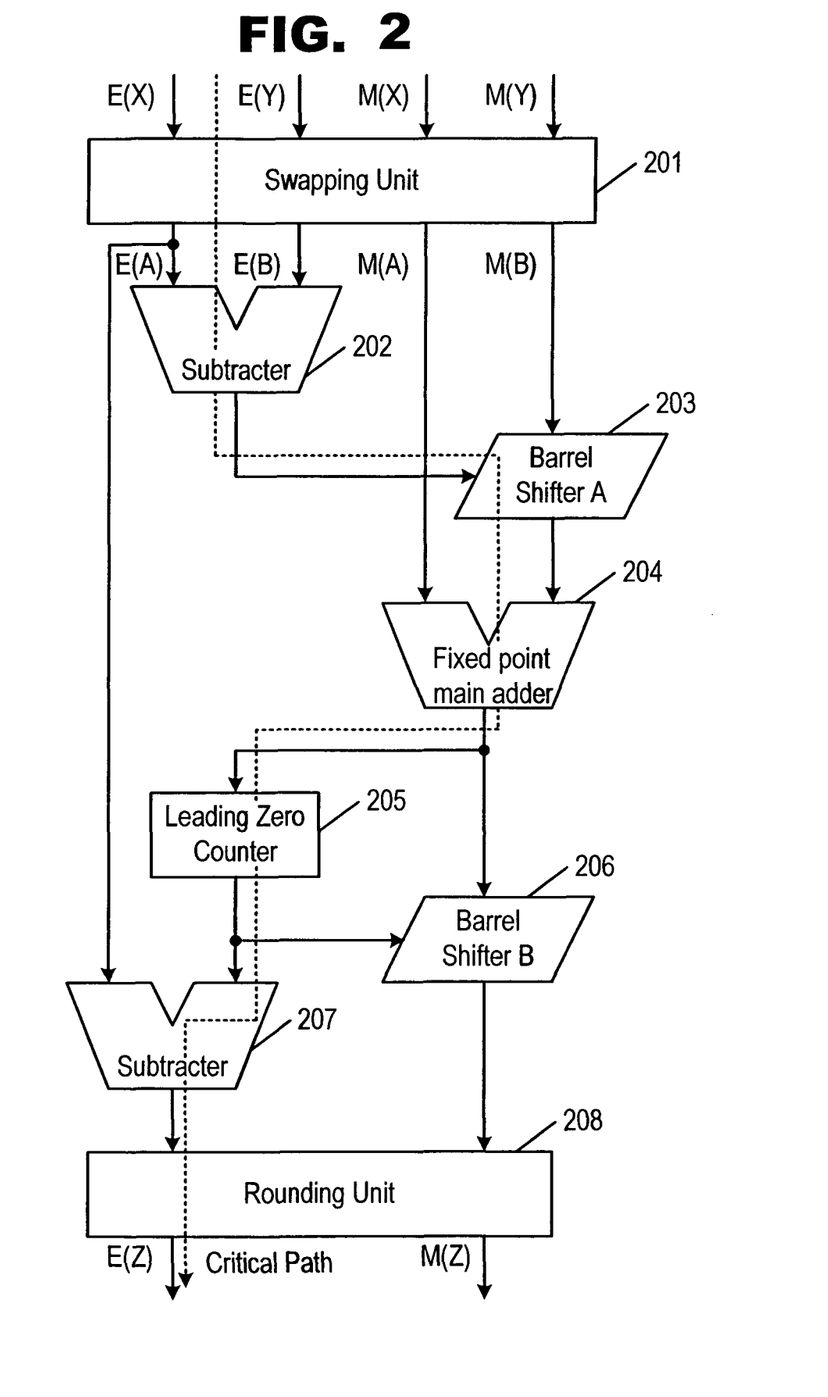
FIG. 2 illustrates a floating-point adder of a conventional style.

FIG. 2 illustrates a floating-point adder of a conventional style. First, absolute values of two inputs X and Y are compared in swapping unit 201. The larger one is selected as A and the smaller one is selected as B. Here E(x) represents the exponent and M(x) represents the mantissa for floating-point number x. If X>Y, E(X) and M(X) are respectively output as E(A) and M(A).

In a barrel shifter A 203, the mantissa for B (M(B)) is shifted to the right direction based on the difference between E(A) and E(B) calculated by subtracter 202. This is referred to as an alignment. Then in a fixed point main adder 204, the mantissa for A (M(A)) is added or subtracted with the shifted M(B) according to the sign bit of X and Y.

The calculation result from the fixed point main adder 204 is provided to a leading zero counter 205, which counts the number of consecutive zeros from the most significant bit (MSB) and outputs the leading zero count to a barrel shifter B 206. The leading zero count is also used to adjust the exponent.

When the subtraction happens and the result becomes smaller, the calculation result of the fixed point adder 204 is shifted left depending on the leading zero count by a barrel shifter B 206, which is referred to as a Normalization. The barrel shifter B 206 outputs the shift result to a rounding unit 208. The subtracter 207 subtracts the leading zero count from the exponent E(A) and outputs the subtraction result to the rounding unit 208. The rounding unit 208 executes rounding and outputs E(Z) and M(Z) as the final calculation result. In FIG. 2, the dotted line shows a critical path in the floating-point adder.

The value of a floating-point number X in the conventional floating-point format is expressed using the integer values of exponent E(X), mantissa M(X) and sign S(X) as a following formula (1).

$$X = (-1)^{S(X)}(M(X)+h)2^{E(X)+q} \qquad (1)$$

Herein q is an integer constant for the offset, and h is an integer constant representing the hidden mantissa.

Even with the type of floating-point adder shown above, its implementation is complicated and the size of the adder is several times larger than the integer adder because the barrel shifter and the subtracter need relatively large size logic circuits, which make the critical path longer. In addition, a logic delay of the adder is also large, which results in the operating clock frequency being limited and is sometimes required to prepare additional pipeline stages that also require the extra hardware size.

SUMMARY

According to a first aspect of the invention, there is a provided a circular floating-point number generator for generating, from an input fixed-point number, a circular floating-point number including sign-bit field (S), exponent field (E), and circular-mantissa field (M). The generator comprises a slot assigning unit configured to assign the input bits in the fixed-point number to a plurality of slots, each slot having a predetermined number of bits, a sign-bit generating unit configured to generate the sign-bit field (S) according to a sign of the input fixed-point number, an exponent generating unit configured to generate the exponent field (E) based on a bit position of a leading significant bit having a value of 1 in the input fixed-point number, a mantissa generating unit configured to generate the mantissa field (M) by extracting a first bit group having bits following the leading significant bit within the same slot, extracting a second bit group having bits that correspond to a difference of a number of bits between the predetermined bits and the bits included in the first bit group from a start bit of a next slot to the slot including the leading significant bit, and providing a start bit of the first bit group after a last bit of the second bit group.

According to a second aspect of the invention, there is a provided a circular floating-point adder for adding two circular floating-point numbers generated by the circular floating-point number generator described above. The adder comprises a decoder configured to extract circular positions respectively indicating a position of the most significant bit in mantissa of each circular floating-point number, from each of exponents of the circular floating-point numbers input to the circular floating-point adder, an unfolding unit configured to unfold the mantissas according to the circular positions, an adder configured to add the unfold mantissas according to a sign bit of each circular floating-point number and a folding unit configured to fold an addition result to generate the circular mantissa.

According to a third aspect of the invention, there is a provided a method of generating, from an input fixed-point number, a circular floating-point number including sign-bit field (S), exponent field (E), and circular-mantissa field (M). The method comprising steps of assigning the input fixed-point number to a plurality of slots, each slot having a predetermined number of bits, generating the sign-bit field (S) according to a sign of the input fixed-point number, generating the exponent field (E) based on a bit position of a leading significant bit having a value of 1 in the input fixed-point number, and generating the mantissa field (M) by extracting a first bit group having bits following the leading significant bit within the same slot, extracting a second bit group having bits corresponding to a difference of a number of bits between the predetermined bits and the bits included in the first bit group from a start bit of a next slot to the slot including the leading significant bit, and providing a start bit of the first bit group after a last bit of the second bit group.

According to a fourth aspect of the invention, there is a provided a method for adding two circular floating-point numbers using a circular floating-point adder. The method comprising steps of extracting circular positions respectively indicating a position of the most significant bit in mantissa of each circular floating-point number, from each of the exponents of the circular floating-point numbers input to the circular floating-point adder, unfolding the mantissas according to the circular positions, adding the unfold mantissas according to a sign bit of each circular floating-point number, and folding an addition result to generate the circular mantissa.

DETAILED DESCRIPTION

Embodiments of the present invention will now be described with reference to the attached drawings. Each embodiment described below will be helpful in understanding a variety of concepts from the generic to the more specific.

It should be noted that the technical scope of the present invention is defined by claims, and is not limited by each embodiment described below. In addition, not all combinations of the features described in the embodiments are always indispensable for the present invention.

Embodiments of the present invention follow a basic concept described below. If the length of the mantissa is adequate, the mantissa can be handled as an integer. The addition of integers is simple to calculate. In addition, for the mantissa, extreme accuracy is not required and the least significant bits (LSB) may be truncated or rounded. The basic concept comes from imagining the infinite length of mantissa where mantissa bits are represented by an 8-bit unit.

(Circular Floating-Point Format)

Figure 3:
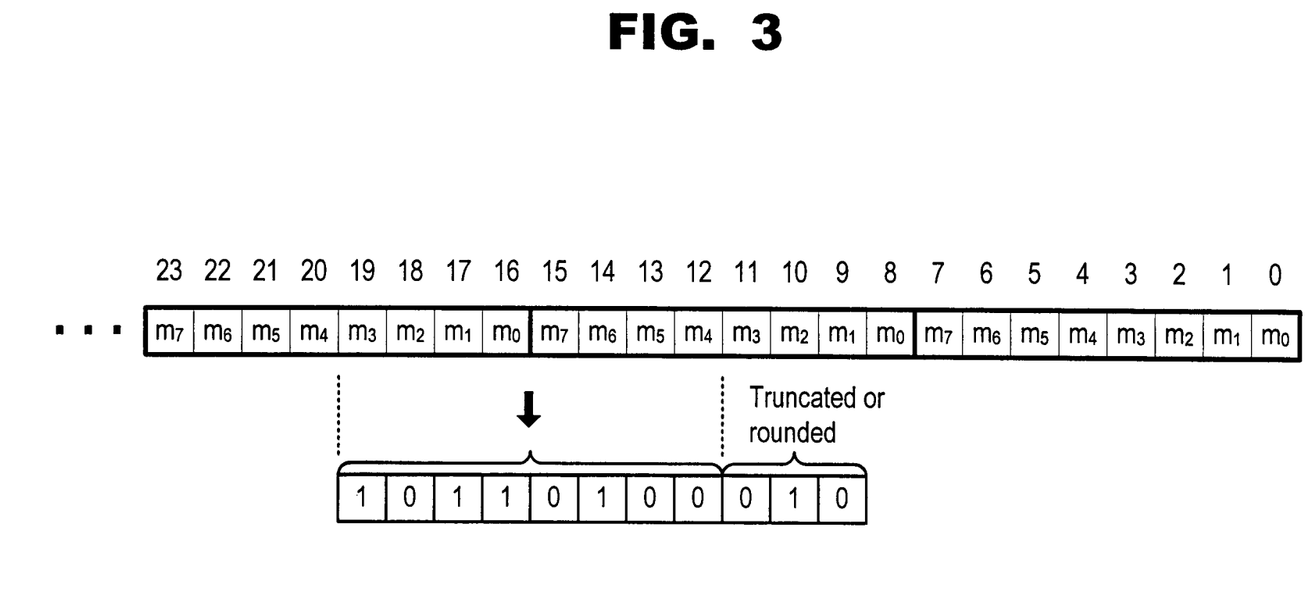
FIG. 3 shows an example of virtual mantissa with infinite length and also shows how to store the fixed-point number.

FIG. 3 shows an example of circular mantissa with infinite length and also shows how to store the fixed-point number. The circular mantissa is constituted by an 8-bit unit including m0-m7 and the 8-bit unit is circulated in the mantissa. For example, the mantissa bit m3 may represent bits 3, 11, 19 and etc. However in the present invention, only one of these bits is selected and stored in a register for the mantissa. The 8-bits to be selected is determined based on the first bit having a value of "1" from the MSB. For example, it is assumed that a 24-bit fixed-point number (constituted by bits 23-0) is input and the values of bits 23-20 are "0" and the leading significant bit having value of "1" is bit 19, while the 8 bits to be selected are determined from the bits 19-12 without considering a hidden bit. In this case, since bit 19 is more significant than bits 11 and 3, the register for m3 should be used to store the value of bit 19 and bit 11 may be truncated or rounded.

Figure 4A:
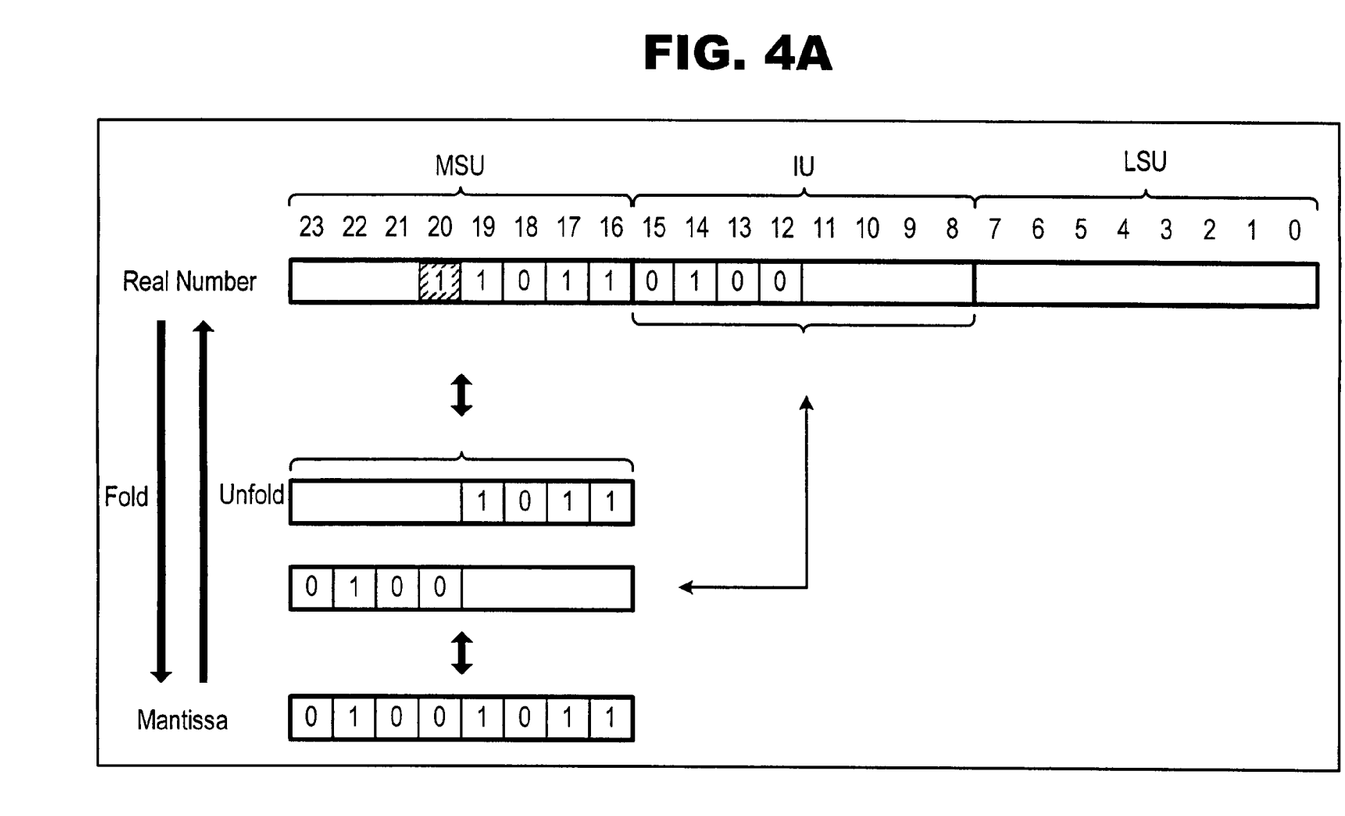
FIG. 4A illustrates an example of the folding and unfolding processing according to embodiments of the present invention.
Figure 4B:
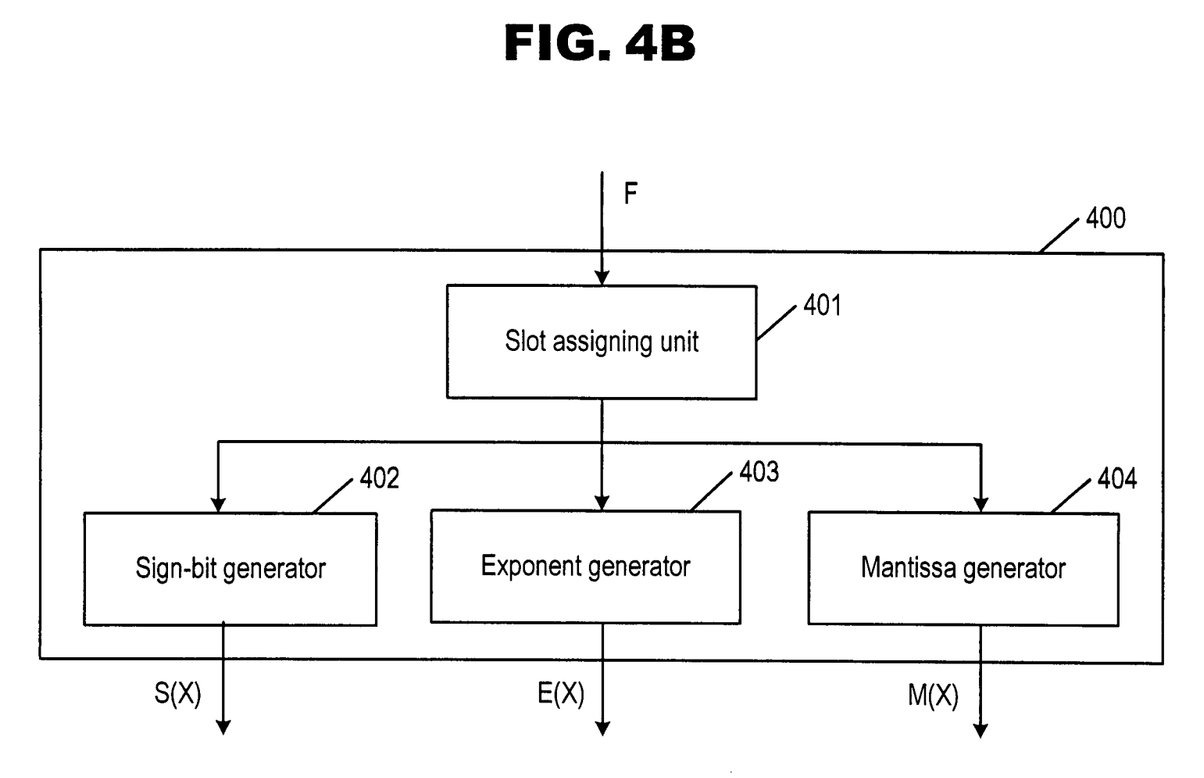
FIG. 4B illustrates a block diagram of a circular floating-point number generator according to embodiments of the present invention.

In the embodiments according to the present invention, a conversion of the fixed-point number into the mantissa is referred to as "folding" and inverse conversion of the mantissa into a fixed-point number is referred to as "unfolding". FIG. 4A illustrates an example of the folding and unfolding processing in the sense of the embodiments of the present invention. FIG. 4B illustrates a block diagram of a circular floating-point number generator executing folding processing according to the embodiments of the present invention.

The generator 400 includes register including a plurality of slots where input fixed-point number F is assigned and outputs circular floating-point number X={S(X), E(X), M(X)}. The input fixed-point number F is provided to a sign-bit generator 402, an exponent generator 403 and a mantissa generator 404, respectively.

The sign-bit generator 402 generates sign-bit field S(X) according to the sign of the input fixed-point number F. The exponent generator 403 generates the exponent field E(X) of circular floating-point number X according to the bit position of the next bit to a leading significant bit having a value of 1. For example, the leading significant bit in FIG. 4A is a bit 20 and the next bit to the leading significant bit is a bit 19. Therefore, the exponent E(X) represents the bit position of bit 19.

The mantissa generator 404 generates the mantissa field M(X) of circular floating-point number X from the input fixed-point number F. The input 24-bit fixed-point number F is divided into 3 units by 8-bit unit as described in relation to FIG. 3 and the slot assigning unit 401 has 3 slots for storing each 8-bit unit. Here, the unit including bits 23-16 is referred to as the most significant unit (MSU), similarly, the units including bits 15-8 and 7-0 are respectively referred to as the intermediate unit (IU) and the least significant unit (LSU).

In the folding process, the leading significant bit having a value of "1" is bit 20 and the 8-bits are selected from bit 19 to bit 12 which belongs to the MSU and IU. Bit 20 is treated as a hidden bit. The bits belonging to the MSU are selected first, and stored in the register prepared for the mantissa generator to generate the mantissa. Then, the bits belonging to the IU are selected and stored in the remaining area in the register. According to this folding process, the register stores an 8-bit mantissa, which is referred to in the embodiments as the "circular mantissa".

In order to know a circular position that indicates a position of the MSB (bit 19) in the circular mantissa, the exponent field is generated. The exponent field E(X) represents the exponent of the circular floating-point number X and at the same time, the least significant 3 bits of E(X) represent the circular position.

Figure 5:
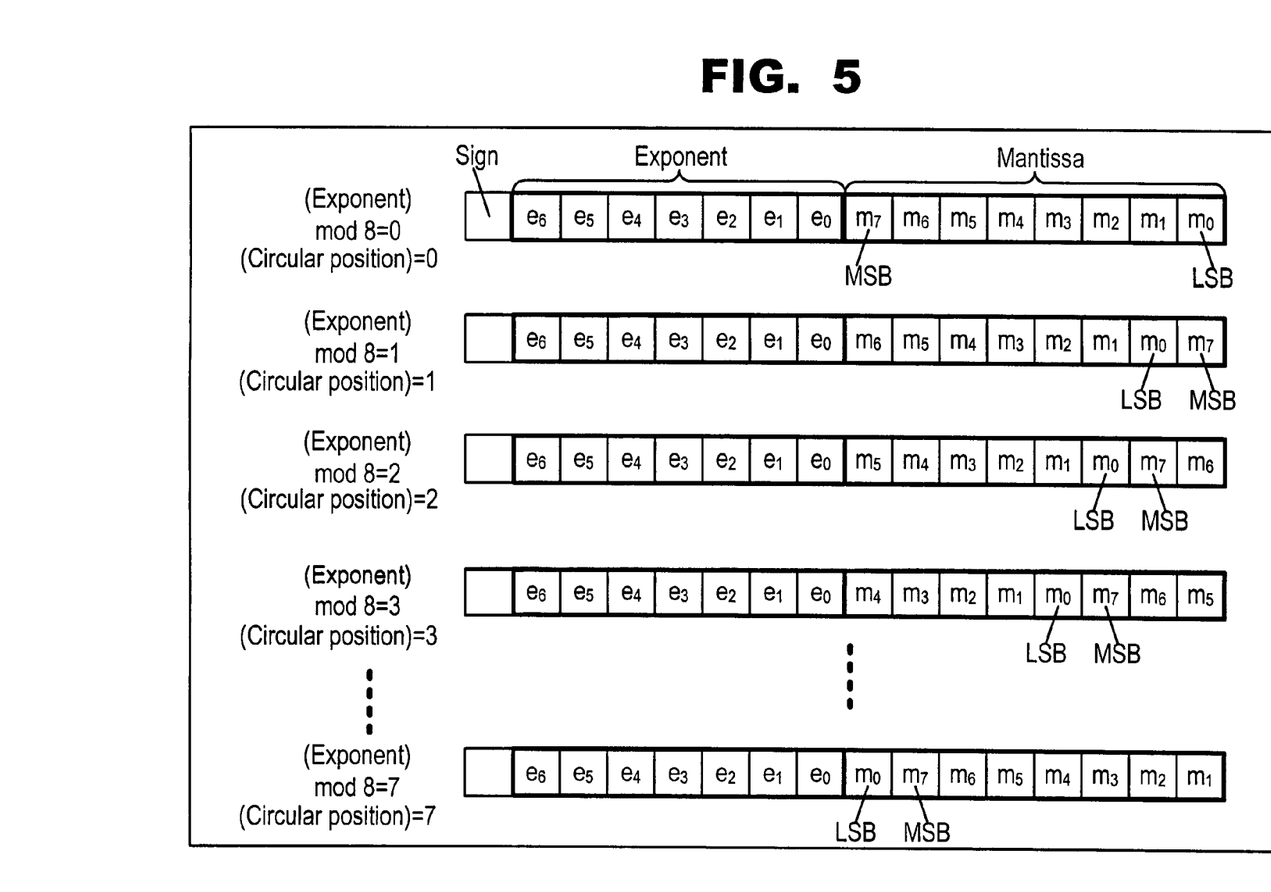
FIG. 5 shows examples of the circular floating-point format according to the embodiments of the present invention.

By combining the generated exponent and the circular mantissa, the floating-point format according to the embodiments of the present invention is generated which is referred to as "circular floating-point format" in the embodiments. FIG. 5 shows examples of the circular floating-point format according to the embodiments of the present invention. As illustrated in FIG. 5, there are eight patterns of circular mantissa that differ depending on the position of MSB and LSB. The exponents are different from each other, corresponding to the position of MSB (circular position) and the least significant 3 bits of each exponent can indicate the circular position. The basic structure of the circular floating-point format is based on IEEE 754, but the mantissa is 8 bits long and its total length is 16 bits long.

In the unfolding process, the circular position is identified based on the least significant 3 bits of the exponent, and the bits are realigned. For example, as shown in FIG. 4A, the mantissa is divided into the two parts "0100" and "1011," and the latter includes the MSB and "1011" written into the register from the bit that is identified by the value of the exponent, and the remaining 4 bits of "0100" are written into the subsequent area in the register. By this unfolding processing, bit 19 to bit 12 is occupied by the "0" of "1" according to the mantissa.

(A Circular Floating-Point Adder)

Figure 6:
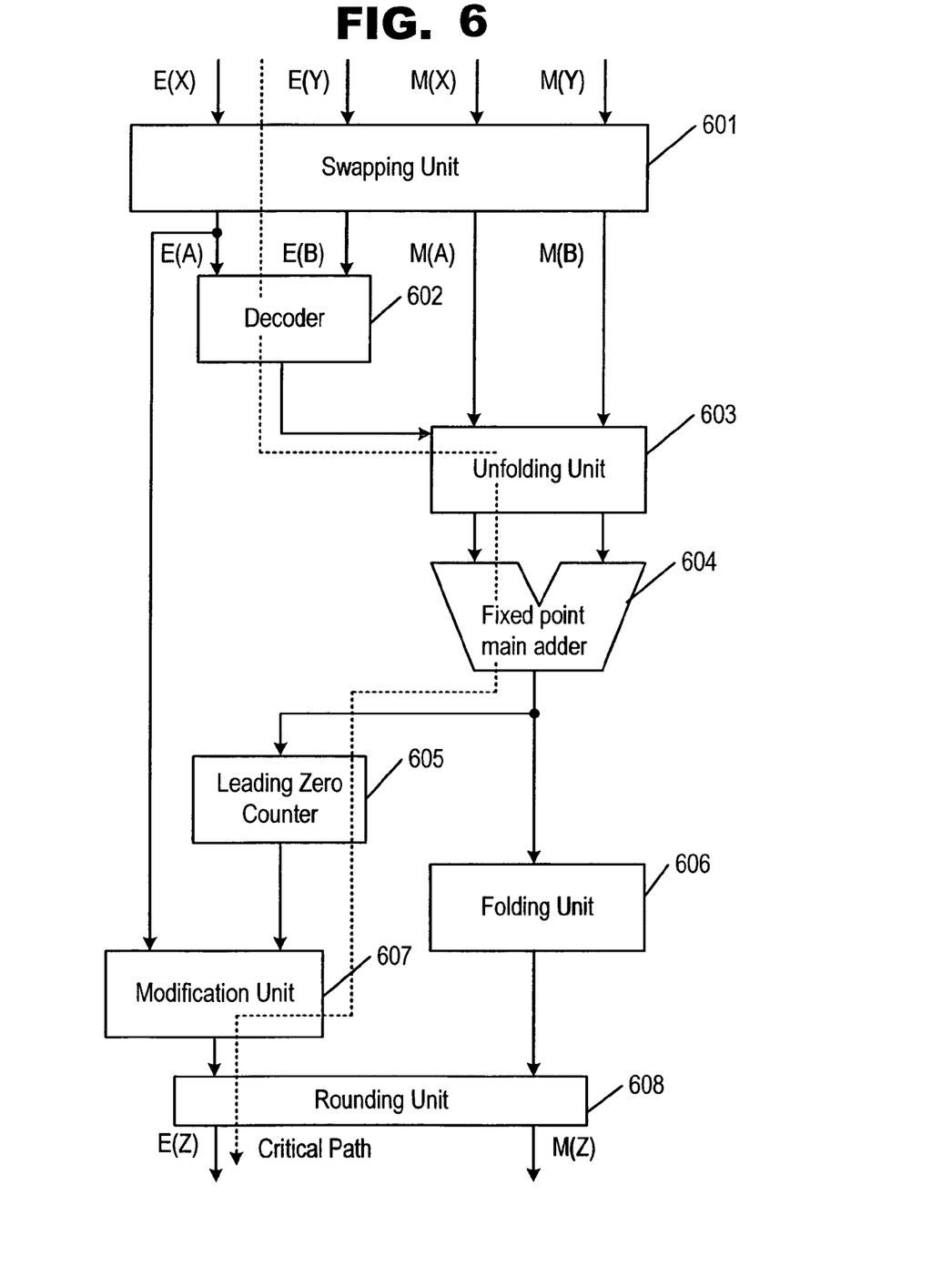
FIG. 6 illustrates a circular floating-point adder according to the embodiment of the present invention.

With reference to FIG. 6, the addition or subtraction with two circular floating-point numbers will be described below. FIG. 6 illustrates a circular floating-point adder according to the embodiment of the present invention. The circular floating-point adder may be achieved using a logic circuit having processing functions and memory functions including ASIC, DSP, FPGA or other programmable logic circuit, or a CPU and a work memory for the CPU.

First, two circular floating-point numbers {E(X), M(X)} and {E(Y), M(Y)} are input to a swapping unit 601 and the swapping unit 601 compares them. Next, the exponents E(X) and E(Y) are compared and if one is larger than the other, the larger one is identified as E(A) and the smaller one is identified as E(B). The corresponding mantissa M(X) and M(Y) are respectively identified as M(A) or M(B). When the E(X) and E(Y) are the same, the mantissa M(A) and M(B) are compared and the larger one is identified as M(A) and the corresponding exponent is identified as E(A). The smaller mantissa is identified as M(B) and the corresponding exponent is identified as E(B). The swapping unit 601 outputs E(A) and E(B) to a decoder 602 and M(A) and M(B) to an unfolding unit 603. The exponent E(A) is also provided to a modification unit 607.

Figure 7A:
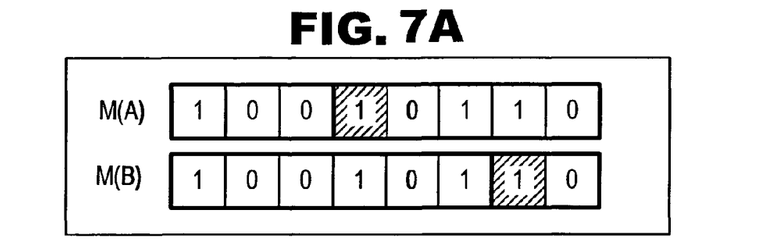
FIG. 7A shows an example of mantissa M(A) according to the embodiment of the present invention.

FIG. 7A shows an example of mantissa M(A) having bits "10010110" and M(B) having bits "10010110". In this example, bits having "1" shown in hatching represents the MSB. Therefore, the respective circular positions of M(A) and M(B) is 5 and 2.

Figure 7B:
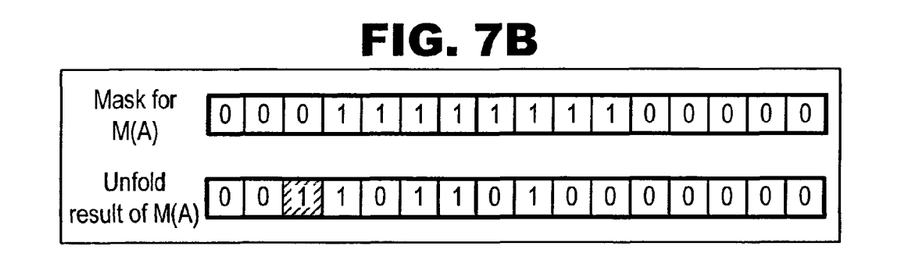
FIG. 7B shows an example of a mask for the mantissa M(A) and the unfold result of the mantissa using the mask.
Figure 7C:
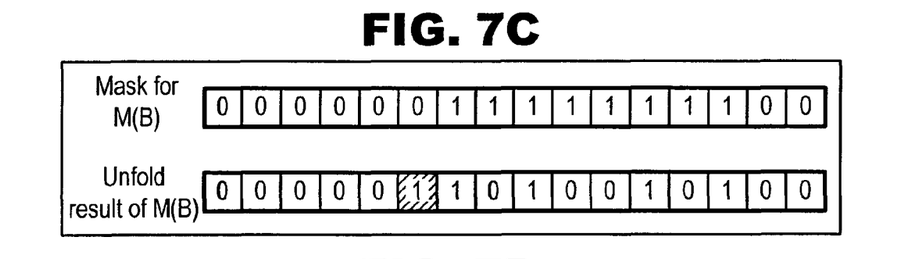
FIG. 7C shows an example of a mask for the mantissa M(B) and unfold result of the mantissa using the mask.

In the decoder 602, from the exponents E(A) and E(B), the least significant 3 bits are extracted and output to an unfolding unit 603. The decoder 602 also generates a mask to be used in unfolding based on the extracted 3 bits. FIGS. 7B and 7C show examples of masks for M(A) and M(B), respectively. In this embodiment, the mask has 16 bits and the significant bits are represented by "1" and others are represented by "0". The start position of the significant bit is determined by the circular position identified by the least significant 3 bits extracted from the exponents. For example as shown in FIG. 7B, if the least significant 3 bits indicates the circular position of 5 as shown for M(A), the first significant bit is assigned to the fourth bit from the starting bit and the 7 subsequent bits are determined as the significant bit. For another example as shown in FIG. 7C, if the least significant 3 bits indicates the circular position of 2 as shown for M(B), the leading significant bit is assigned to the seventh bit from the starting bit and the 7 subsequent bits are determined as the significant bit.

The unfolding unit 603 unfolds M(A) and M(B) using the circular position and the mask from the decoder 602. The unfolding unit 603 divides each mantissa into two parts including a former part and a latter part based on the circular position and the latter part is written into the 16-bit register assigned to the unfolding unit 603 using the mask provided from the decoder 602. For example of the M(A), the former part has "100" and the latter part has "10110," while the latter part is written into the register using the mask for M(A). In this case, a start bit of a former part "100" is provided after a last bit of a latter part "10110". The unfold result of M(A) ($M_u(A)$) is shown in FIG. 7B. In this case, a hidden bit is added in front of the leading bit of the latter part, which is shown with hatching in FIG. 7B. This is because when the M(A) was generated from the fixed-point number, the leading 1 bit, which always has the value of "1," had been omitted, and when executing the unfolding, the hidden bit should be restored.

For another example of M(B), the former part has "100101" and the latter part has "10" and the latter part is written into the register using the mask for M(B). In this case, a start bit of a former part "100101" is provided after a last bit of a latter part "10" and the hidden bit (which is shown with hatching in FIG. 7C) is also restored in front of the leading bit of M(B). The unfold result of M(B)($M_u(B)$) is shown in FIG. 7C.

Figure 7D:
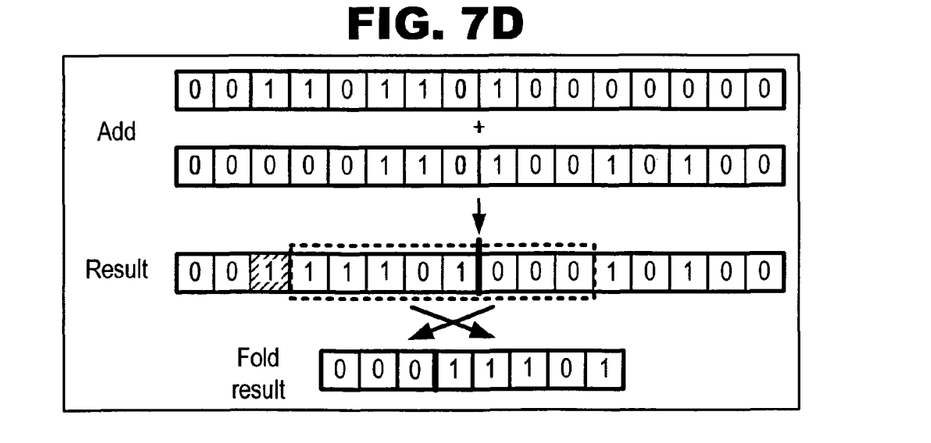
FIG. 7D shows an example of addition of unfolded mantissas and a folding process of the addition result.

The unfolded results $M_u(A)$ and $M_u(B)$ are provided to a fixed point main adder 604. The fixed point main adder 604 executes an addition or subtraction using the $M_u(A)$ and $M_u(B)$ according to the sign bit of input circular floating-point numbers using registers. FIG. 7D shows an example of the addition of $M_u(A)$ and $M_u(B)$.

The calculation result from the fixed point main adder 404 is provided to a leading zero counter 605 and a folding unit 606. The leading zero counter 605 counts the number of consecutive zeros from the MSB and outputs the leading zero count to a folding unit 606 and a modification unit 607.

The unfolding unit 606 unfolds the calculation result from the fixed point main adder 604 to generate the mantissa using a register. FIG. 7D shows an example of the mantissa as a folding result. The calculation result is a 16-bit binary data that is divided into two parts by an 8-bit unit. The leading significant bit shown with hatching is designated as the hidden bit and the next bit to the leading significant bit is used to generate the mantissa. In the example of FIG. 7D, "11101" is extracted from a former 8-bit unit as a first bit group and the "000" is extracted from a latter 8-bit as a second bit group. The first bit group has bits following a leading bit having a value of 1 within the same slot in the addition result. The second bit group has bits corresponding to a difference of a number of bits between 8 bits and the bits included in the first bit group from a start bit of the latter 8-bit. The folding unit generates the mantissa having bits of "00011101" by providing the start bit of the first bit group "11101" after the last bit of the second bit group "000". After the folding process, the mantissa is rounded in a rounding unit 608 and output as M(Z).

The merging unit 707 receives the exponent E(A) from the decoder 602 and the leading zero count from the leading zero counter 605. The exponent E(A) represents a position of a next smaller bit to the leading significant bit designated as the hidden bit. For example, a case as shown in FIG. 4, bit 19 is the next smaller bit to the leading significant bit 20. Here, the size of the fixed-point number is predetermined, for example, 24 bits. The leading zero count and the exponent E(A) are used to identify whether there is a change of the position of the leading bit. If so, the exponent E(A) is modified according to the leading zero count and if not, the exponent E(A) keeps the same value. The merging unit 707 outputs the merging results E(Z) via the rounding unit 608.

Figure 8:
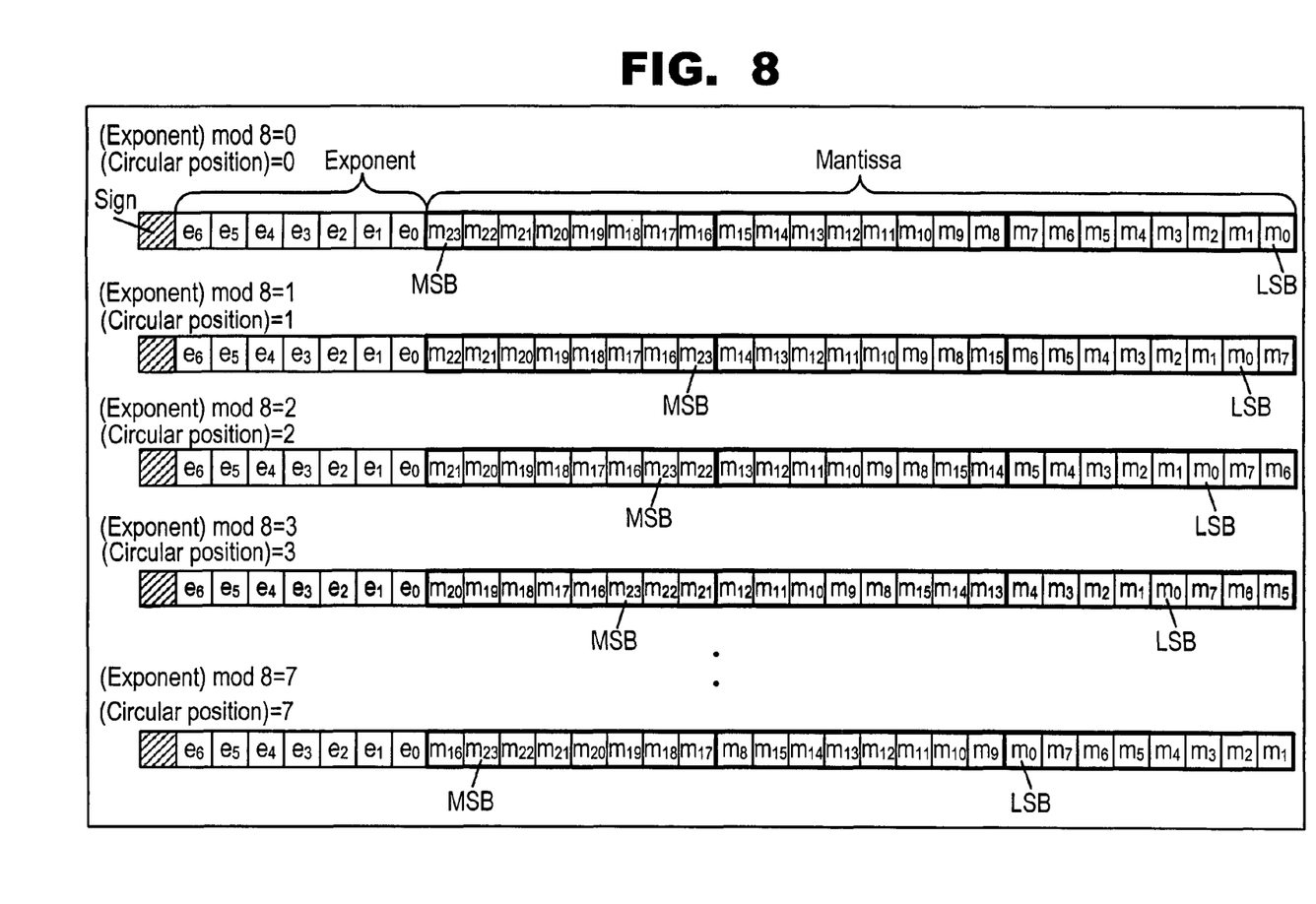
FIG. 8 shows one example of variations of the circular floating-point format with 7 bits exponent and 24 bits partial circular mantissa.

In the following, variations of the circular floating-point format according to the embodiments of the present invention will be described. FIG. 8 shows one example of variations of the circular floating-point format with 7 bits exponent and 24 bits partial circular mantissa. This is referred to as a partial circular floating-point format for larger bit fixed-point numbers, for example, a 32 bit fixed-point number, or for using all bits in a 24-bit fixed-point number in the circular floating-point format. The partial mantissa includes 3 slots each having 8 bits and each slot includes circular mantissa. The exponent represents the position of the bit next to the leading significant bit in the fixed-point number and the least 3 bits of exponent indicates the circular position of each slot in the mantissa. The 24 bits to be used to generate the partial circular mantissa are extracted from the fixed-point number to be processed. The leading bit is 1 bit smaller than the leading significant bit in the fixed-point number and the subsequent 23 bits to the leading bit are used. The circular position is determined for the $1^{st}$ slot including the leading bit and the subsequent $2^{nd}$ and $3^{rd}$ slot are occupied by the remaining bits based on the same circular position as the $1^{st}$ slot.

(Variation of Circular Floating-Point Format and an Adder)

Figure 9:
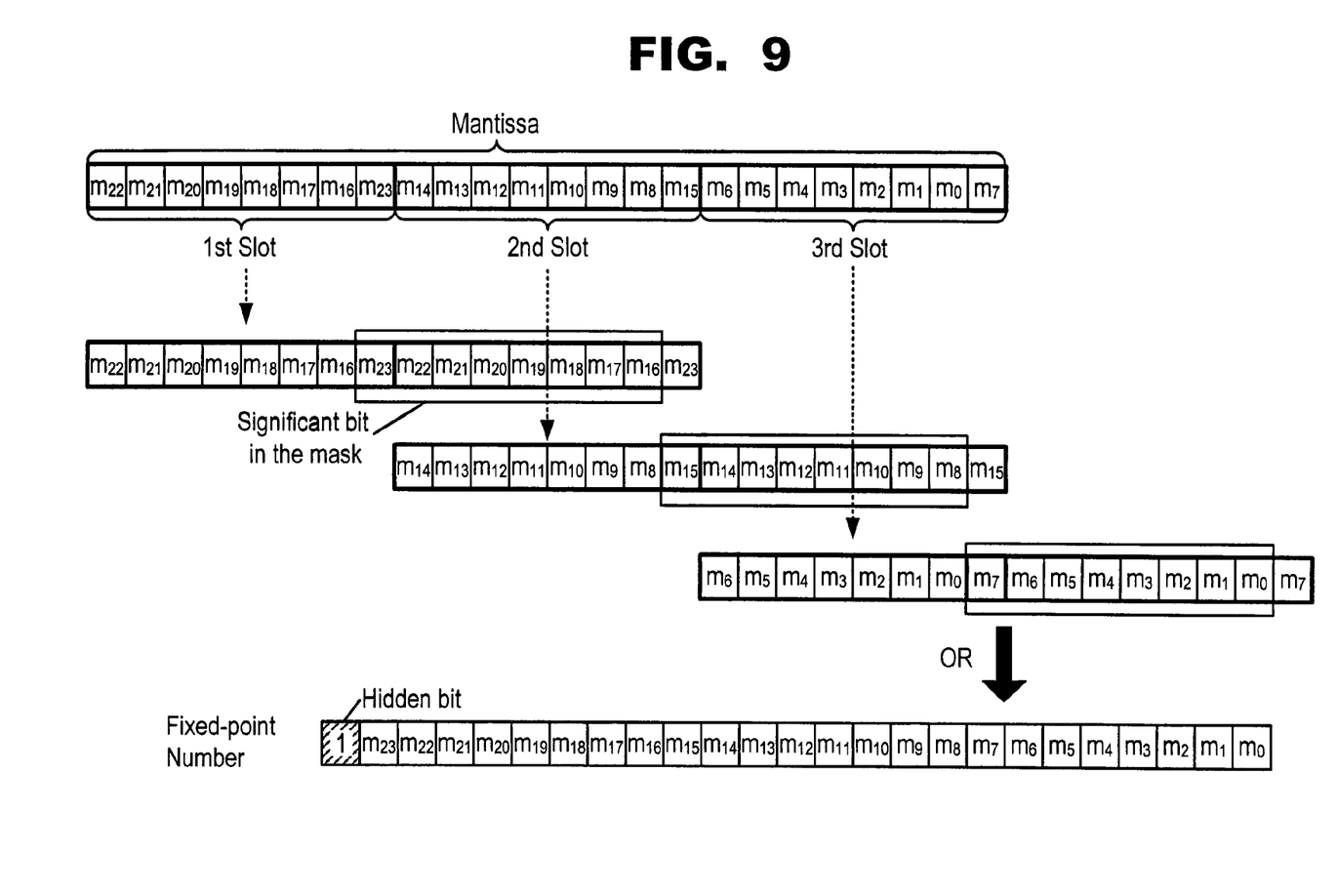
FIG. 9 illustrates an example of the unfolding of the partial circular mantissa.

FIG. 9 illustrates an example of an unfolding of the partial circular mantissa. As shown in FIG. 9, the mantissa includes 3 slots each having 8 bits. For each slot, unfolding is executed and a 16-bit mask is generated to extract bits in normal order according to the bit position in the fixed-point number. For example, the $1^{st}$ slot includes bits $m_{23}$ to $m_{16}$ and the mask is generated such that it can extract the bits in the normal order from $m_{23}$ to $m_{16}$ as shown in FIG. 9. The position of the significant bit ("1") in the mask may be determined by the circular position, for example, the circular position of the $1^{st}$ slot shown in FIG. 9 is 1. Similarly, from the $2^{nd}$ and $3^{rd}$ slots, bits $m_{15}$ to $m_8$ and $m_7$ to $m_0$ are extracted using the same mask and all extracted bits are connected to generate the fixed-point number.

Figure 10:
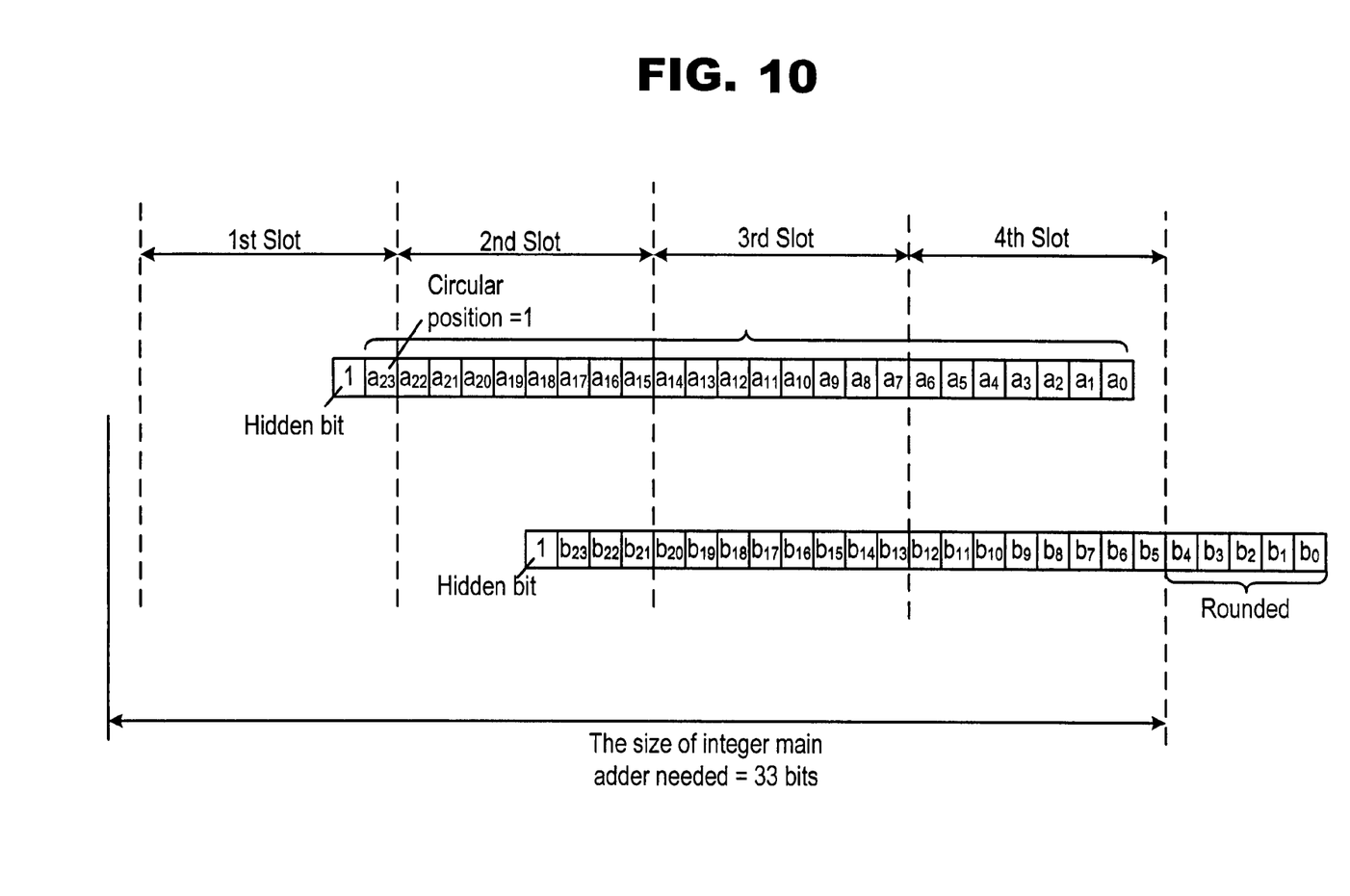
FIG. 10 shows one example of unfolded results of partial circular mantissas.

When the partial circular mantissa is used in the addition or subtraction calculation according to the flowchart of FIG. 6, a 33 bits register is prepared for the calculation, having 4 slots that each have 8 bits and an additional 1 bit for the hidden bit as shown in FIG. 10. FIG. 10 shows one example of unfolded results of partial circular mantissas. In this example, the unfolding unit 603 determines the start slot to which the mantissa of M(A) and M(B) are unfolded. First, for M(A), the leading bit of the unfolded mantissa must be placed in the $1^{st}$ slot. The start slot position for the unfolded mantissa M(B) is determined according to the following formula (2).

$$\left\lfloor \frac{E(A)}{2^n} \right\rfloor - \left\lfloor \frac{E(B)}{2^n} \right\rfloor \qquad (2)$$

wherein $2^n$ represents the size of the slot, and in the embodiments of the present invention n=3. However, the slot size is not limited to the 8 bits and other sizes may be applicable. In the case shown in FIG. 10, a part of unfolded mantissa of M(B) cannot be stored in the register and may be rounded. The main addition or subtraction is made between the unfolded mantissas. Then the result is folded into M(Z). The least significant 3 bits of E(Z) is determined by the result of the leading zero count and the most significant 4 bits of E(Z) is given by $$\left\lfloor \frac{E(A)}{2^3} \right\rfloor + s \ (s = 0, \pm 1)$$

except the special or zero value.

In the circular floating-point, the circular position always correspond to the least significant 3 bits of exponents, while in the conventional floating-point format, the relative value of the exponent is calculated by subtraction between exponents, then the leading zero count represents the relative value of the exponent and is re-converted to the absolute value of the exponent.

Figure 11:
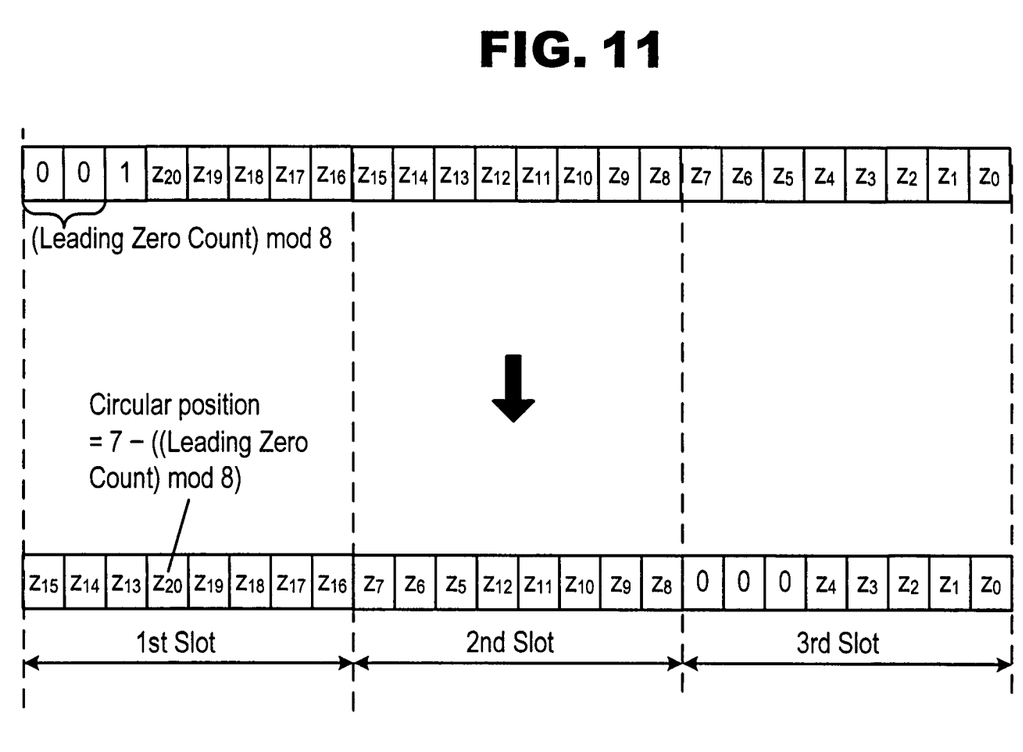
FIG. 11 shows an example of a folding process to generate the partial circular mantissa.

FIG. 11 shows an example of a folding process to generate the partial circular mantissa. As shown in FIG. 11, the most significant bit, which is treated as the hidden bit, is the $3^{rd}$ bit. The leading zero count is "2" and {(the leading zero count) mod 8}=2 which is used to determine the circular position in the mantissa by subtraction of {(the leading zero count) mod 8} from "7". Based on the determined circular position, the fixed-point number is folded into the mantissa as shown in FIG. 11.

(General Expression of Circular Floating-Point Format)

In general, the circular position can be expressed as a following formula (3).

$$((E(X)+p) \bmod c) \qquad (3)$$

Herein a parameter c represents a circular size [bit], and p represents an offset position, E(X) represents an exponent value. The circular position is equal to the bit position of $m_0$.

The bit position of $m_i$ in the mantissa M(X) is expressed as a following formula (4).

$$((E(X) + p + (i \bmod c)) \bmod c) + c \left\lfloor \frac{i}{c} \right\rfloor \qquad (4)$$

Herein, the bit $m_i$ is placed at slot $$\# \left\lfloor \frac{i}{c} \right\rfloor$$

and the bit position in the slot is expressed by $$((E(X) + p + (i \bmod c)) \bmod c).$$

$$\mathrm{BIT}(a, b) = \left\lfloor \frac{a}{2^b} \right\rfloor \bmod 2 \qquad (5)$$

The formula (5) is used to extract a bit #b from an integer a. Then the de-circulated mantissa $\tilde{M}(x)$, which is the circulated mantissa M(X) converted into the conventional floating format, can be expressed as a following formula (6).

$$\tilde{M}(X) = \sum_{i=0}^{L-1} 2^i \, \text{BIT}\!\left(M(X), \left(((E(X)+p+(i \bmod c)) \bmod c) + c\left\lfloor\frac{i}{c}\right\rfloor\right)\right) \quad (6)$$

By applying the formula (6) to the formula (1), the value of circular floating-point number X is expressed as a following formula (7).

$$X = (-1)^{S(X)} \quad (7)$$
$$\left(\left(\sum_{i=0}^{n-1} 2^i \text{BIT}\!\left(M(X), \left(((E(X)+p+(i \bmod c)) \bmod c) + \left\lfloor\frac{i}{c}\right\rfloor\right)\right)\right) + h\right) 2^{E(X)+q}$$

Herein, c is an integer value (c>1) representing the circular size, p is an integer value representing the offset for the exponent, q is an integer offset for the circular position, L represents the bit length of M, and $m_i(0 \le i \le L-1)$ represents the each bit in M.

(A Conventional Floating-Point Adder Utilizing a Circular Floating-Point Adder)

The conversion between circular floating-point format and conventional floating-point format can be performed by rotating the mantissa depending on the exponent. The circular floating-point adder can be used for the addition of conventional floating-point format numbers together with the conversion circuits.

The logic delay in the circular floating-point adder can be smaller than the conventional floating-point adder and the conversion circuit can be isolated from the critical path in the adder and the impact for the critical delay can be avoided.

Thus the conventional floating-point adder utilizing a circular floating-point adder can work at higher clock frequency than the conventional floating-point adder.

(Advantage of Circular Floating-Point Format)

In the above described embodiments, the cases where the circular floating-point format is used in addition or subtraction calculation are described. However, the circular floating-point format may be used in multiplication.

Figure 12:
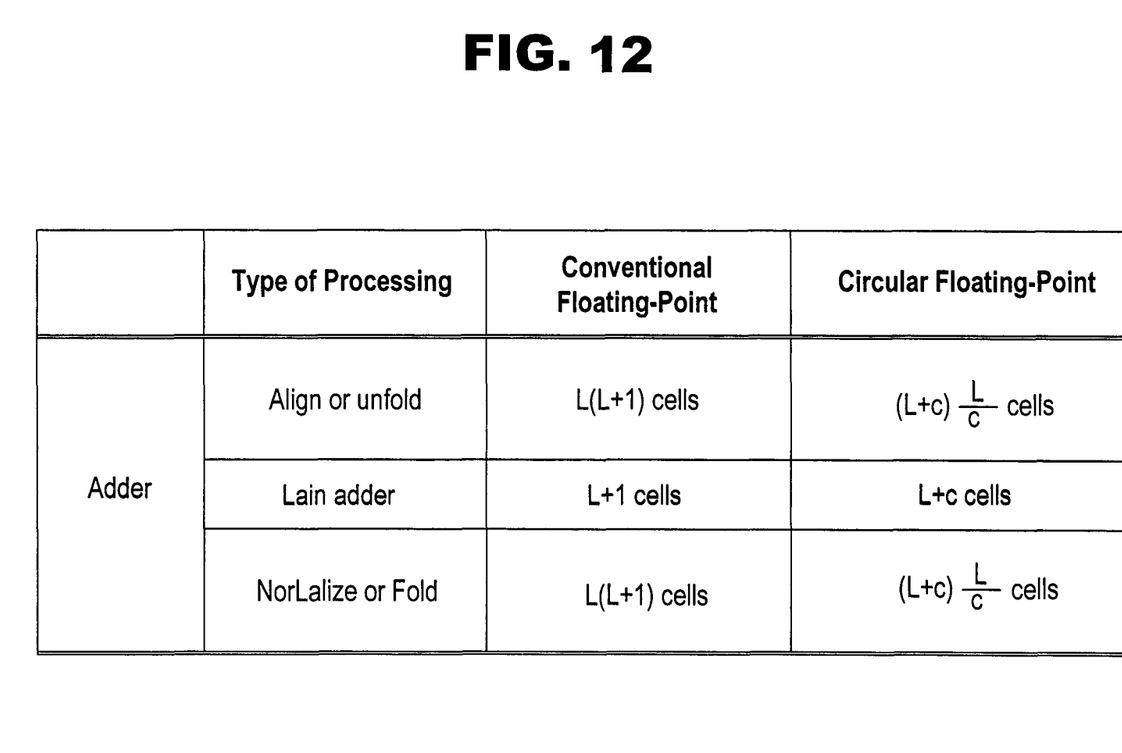
FIG. 12 shows a silicon size comparison with conventional floating-point and circular floating-point.

The advantage of the circular floating-point format against the conventional floating-point format will be understood from a table shown in FIG. 12. FIG. 12 shows a silicon size comparison with conventional floating-point and circular floating-point. In the table, a parameter L represents a mantissa size [bit] and a parameter c represents a circular size [bit].

The unit of comparison here is a cell that may be a multiplexer, full adder or multiplier cell, and the silicon area is different depending on the function, but for the same function it is equivalently compared. Note that the silicon size with these formats will be the same when we set c=1. As shown in FIG. 12, the circular floating-point format according to the present invention is beneficial for the addition operation and can reduce the size of the adder. The advantage will be especially greater as we use the large mantissa.

In the circular floating-point format, the circular positions in the input or output are directly determined by the least significant bits of the exponents and only the slot number is relatively computed, while in the conventional floating-point format, the calculation is made by converting it into the relative value, which is achieved by computing the difference of exponents, and then re-converting it to an absolute value.

Thus the logic delay for the addition with the circular floating-point format can be shorter than the calculation with a conventional floating-point.

When calculating a conventional floating-point format number, format conversion circuits can be used without adding the logic delay in the critical path.

The invention claimed is:

1. A circular floating-point number generator for generating, from an input fixed-point number, a circular floating-point number including sign-bit field (S), exponent field (E), and circular-mantissa field (M), comprising:
   a slot assigning unit configured to assign the input bits in the fixed-point number to a plurality of slots, each slot having a predetermined number of bits;
   a sign-bit generating unit configured to generate the sign-bit field (S) according to a sign of the input fixed-point number;
   an exponent generating unit configured to generate the exponent field (E) based on a bit position of a leading significant bit having a value of 1 in the input fixed-point number; and
   a mantissa generating unit configured to generate the mantissa field (M) by extracting a first bit group having bits following the leading significant bit within the same slot, extracting a second bit group having bits that correspond to a difference of a number of bits between the predetermined bits and the bits included in the first bit group from a start bit of a next slot to the slot including the leading significant bit, and providing a start bit of the first bit group after a last bit of the second bit group.

2. A circular floating-point number generator according to claim 1, wherein a value of a circular floating-point number X is expressed using the sign-bit field (S), the exponent field (E), and the circular-mantissa field (M), as $$X = (-1)^S \left(\left(\sum_{i=0}^{L-1} 2^i \text{BIT}\!\left(M, \left(((E+p+(i \bmod c)) \bmod c) + c\left\lfloor\frac{i}{c}\right\rfloor\right)\right)\right) + h\right) 2^{E+q}$$

herein $\text{BIT}(a, b) = \left\lfloor\frac{a}{2^b}\right\rfloor \bmod 2$, c is an integer value larger than 1 representing the circular size,
p is an integer constant for the circular offset,
q is an integer constant for the exponent,
h is an integer constant for representing the hidden mantissa, and
L represents the bit length of mantissa filed M.

3. A circular floating-point adder for adding two circular floating-point numbers generated by the circular floating-point number generator according to claim 1, comprising:
   a decoder configured to extract circular positions respectively indicating a position of the most significant bit in mantissa of each circular floating-point number, from each of exponents of the circular floating-point numbers input to the circular floating-point adder;
   an unfolding unit configured to unfold the mantissas according to the circular positions;
   an adder configured to add the unfold mantissas according to a sign bit of each circular floating-point number; and
   a folding unit configured to fold an addition result to generate the circular mantissa.

4. A circular floating-point adder according to claim 3, wherein,
   said unfolding unit further configured to divide each mantissa into two parts based on the circular position and to unfold each mantissa by providing a start bit of a former part after a last bit of a latter part.

5. A circular floating-point adder according to claim 4, wherein,
said unfolding unit is further configured to
write the latter part of a larger one of the circular floating-point numbers to a leading slot of a first plurality of slots, and
write the latter part of a smaller one of the circular floating-point numbers to a slot of a second plurality of slots corresponding to a difference between exponents of the circular floating-point numbers,
wherein the bit length of each slot of the first and second plurality of slots is equal to the circular size c, and the c is an integer power of 2.

6. A circular floating-point adder according to claim 5, wherein
said adder further configured to add mantissas each assigned to the first plurality of slots and the second plurality of slots and to assign the addition result to a third plurality of slots, and
said folding unit further configured to select a third bit group having bits following a leading significant bit having a value of 1 within the same slot in the addition result,
to select a fourth bit group having bits corresponding a difference of a number of bits between 8 bits and the bits included in the third bit group from a start bit of a next slot to the slot including the leading significant bit, and
to fold the addition result by providing a start bit of the third bit group after a last bit of the fourth bit group to generate the circular mantissa.

7. A circular floating-point adder according to claim 3, further comprising:
a counter configured to count a leading zero count from a start bit of the addition result; and
a modification unit configured to modify the exponent of the larger one of the circular floating-point numbers based on the leading zero count.

8. A circular floating-point adder according to claim 3, wherein,
the bit length of each mantissa is an integer multiple of circular size c, and
the circular position is indicated by the least 3 bits of the exponent.

* * * * *